United States Patent [19]

Kaigawa

[11] Patent Number: 5,468,675
[45] Date of Patent: Nov. 21, 1995

[54] METHOD FOR MANUFACTURING A DEVICE SEPARATION REGION FOR SEMICONDUCTOR DEVICE

[75] Inventor: Hiroyuki Kaigawa, Kyoto, Japan

[73] Assignee: Rohm Co., Ltd., Kyoto, Japan

[21] Appl. No.: 249,433

[22] Filed: May 26, 1994

[30] Foreign Application Priority Data

May 26, 1993 [JP] Japan .................................. 5-123752

[51] Int. Cl.⁶ .................................................. H01L 21/76
[52] U.S. Cl. ............................................................ 437/69
[58] Field of Search ....................... 437/69; 148/DIG. 85, 148/DIG. 86, DIG. 117

[56] References Cited

FOREIGN PATENT DOCUMENTS

| | | |
|---|---|---|
| 62-28446 | 12/1987 | Japan . |
| 63-257248 | 10/1988 | Japan . |
| 2219253 | 8/1990 | Japan . |
| 2312234 | 12/1990 | Japan . |
| 3142856 | 6/1991 | Japan . |
| 4130630 | 5/1992 | Japan . |
| 4162528 | 6/1992 | Japan . |
| 4321228 | 11/1992 | Japan . |
| 547775 | 2/1993 | Japan . |

OTHER PUBLICATIONS

Wolf, S. et al, Silicon Processing for the VLSI Era, vol. 1: Process Technology Lattice Press 1986, pp. 168–169.
Wolf, S., Silicon Processing for the VLSI Era, vol. 2: Process Integration, Lattice Press, 1990, pp. 238–239.
"Laterally Sealed LOCOS Isolation", by M. Ghezzo, M. J. Kim, J. F. Norton, and R. J. Saia, *Journal of the Electrochemical Society*, vol. 134, No. 6, Jun. 1987.
"A New Self–Aligned Planar Oxidation Technology", by Kazuhito Sakuma, Yoshinobu Arita, and Masanobu Doken, *Journal of the Electrochemical Society*, vol. 134, No. 6, Jun. 1987.
"Twin–White–Ribbon Effect and Pit Formation Mechanism in PBLOCOS", *Electrochemical Society*, vol. 138, No., Jul. 1991.

*Primary Examiner*—George Fourson
*Attorney, Agent, or Firm*—Merchant, Gould, Smith, Edell, Welter & Schmidt

[57] ABSTRACT

Method for manufacturing a device separation region for semiconductor devices which separates regions electrically from each other stably, and allows realization of large scale integration with high reliability. When forming a device separation region 10 selectively on a substrate 1 by LOCOS method by controlling thermal oxidation, a device separation region 10 is formed to thickness t2 thinner than a predetermined thickness (FIG. 4C). A second silicon nitride layer 5 is formed onto the whole surface of the substrate 1 (FIG. 5A). A photo resist layer 8 is formed on the second silicon nitride layer 5, and the second silicon nitride layer 5 is partially removed by chemical etching (FIG. 5B). By carrying out thermal oxidation again after the etching, the device separation region 10 is formed to the predetermined thickness t (FIG. 5C). In that, device separation is accomplished stably. Also, the device formation region 15 can be formed larger than a conventional one since the occurrence of bird's beak is suppressed by controlling thermal oxidation when forming the device separation region 10. As a result, large scale integration can be realized with high reliability.

4 Claims, 6 Drawing Sheets

5,468,675

METHOD FOR MANUFACTURING A DEVICE SEPARATION REGION FOR SEMICONDUCTOR DEVICE

BACKGROUND OF THE INVENTION

1. Field of the Invention

The present invention relates to a method for manufacturing a device separation region for semiconductor device and more particularly, to a method for manufacturing a device separation region for a semiconductor device which realizes large scale integration with high reliability.

2. Description of the Prior Art

In general, during a process of manufacturing semiconductor devices, the semiconductor devices which locate adjacently are separated electrically with each other. This is to prevent an operating error, when the semiconductor devices are operated. There are several methods to separate the semiconductor devices electrically. One of the most familiar methods to one who is skilled in the art is Local oxidation of silicon (hereinafter referred as LOCOS) method. In LOCOS method, a silicon substrate is oxidized selectively to form a device separation region.

Details of the LOCOS method will be described below based on the figures. Initially, a silicon oxide layer 2 is formed on a substrate 1 by thermal oxidation. Then, a silicon nitride layer is formed on the silicon oxide layer 2 as a first silicon nitride layer 3.

Subsequently, a photo resist layer 8 is formed at a predetermined position on the first silicon nitride layer 3 (FIG. 1A). After forming the photo resist layer 8, the first silicon nitride layer 3 is removed partially by chemical etching by utilizing the photo resist layer 8 as a mask. Then, boron is implanted ionically into the substrate 1 where the first silicon nitride layer 3 is removed (FIG. 1B).

After implantation of boron, the photo resist layer 8 is removed by chemical etching and the surface of the substrate 1 is oxidized. In this way, the bulk of the silicon oxide layer 2 is increased by carrying out thermal oxidization thereto. Since the first Silicon nitride layer 3 has a characteristic that it is hard to oxidize, the part of the silicon oxide layer 2 covered by the first silicon nitride layer 3 does not increase its' bulk. Under this condition, a field oxidation (device separation) layer is formed as a device separation layer 10 in predetermined thickness t by carrying out thermal oxidation at a desired position (see FIG. 1C).

However, once the device separation layer 10 is formed in predetermined thickness t, the device separation layer 10 also grows in the horizontal direction HZ100 toward the surface of the substrate 1. That is, as a result of growth for the device separation layer 10 in the shape of beak of a bird, so called "Bird's beak" (to one who skilled in the art) BB1 is formed in the first nitride layer 3. That is, edges of the device separation layer 10 extend into the region of the first silicon nitride layer 3 (FIG. 1C).

After forming the device separation layer 10, both the first silicon nitride layer 3 and the silicon oxide layer 2 are removed by chemical etching. As a result, as it is shown in FIG. 2A, the device separation layer (device separation region) 10 and a device formation region 15 are formed on the substrate 1.

Subsequently, there will be described a function of the device separation region 10 formed by LOCOS method. For example, when writing a data into a semiconductor device such as memory, an high voltage is applied to the semiconductor device through a conductive layer (not shown) formed on the device separation region 10. In an assumption, for instance, an high voltage is applied to a semiconductor device (not shown) formed on the device formation region 15 on the substrate 1, to write a data therein (see FIG. 2A).

When the high voltage for writing a data is applied to a semiconductor device through the conductive layer, the high voltage is also applied to the substrate 1. The high voltage applied to the substrate 1 turns polarity of surface OS1 in the substrate 1 where it faces the device separation region 10. Turn of polarity of the surface OS1 increases a possibility of making a channel CH1 between the semiconductor device and an adjacent semiconductor device both of which are formed on the device formation region 15 (see FIG. 2A). In order to prevent making the channel CH1, as well as preventing bad influences such as writing a data to the adjacent semiconductor device erroneously (see FIG. 2B), the device separation region 10 is formed to thickness t.

That is, the device separation region 10 formed to thickness t prevents making the channel CH1 between the semiconductor device and the adjacent semiconductor device. In that way, the device separation region 10 is able to prevent erroneous data writing to the adjacent semiconductor device.

However, when forming the device separation region 10 under the conventional method, the bird's beak BB1 is formed because the device separation layer 10 has grown in the horizontal direction HZ100 toward surface of the substrate 1 (FIG. 1C, FIG. 2B). Once the bird's beak BB1 is formed in the substrate 1, the device formation region 15 is narrowed by width W (FIG. 2B, FIG. 3B). That is, to form the device separation region 10 in predetermined thickness which is necessary to separate semiconductor devices electrically, the device separation region 15 is narrowed. As a result, density of integration for the semiconductor devices formed in the substrate 1 is decreased.

Thus, the device separation region (silicon oxide layer) 10 is formed in predetermined thickness t for stable electrical separation of the devices (see FIG. 2B). The thickness t of the device separation region 10 is formed by rapid expansion in the implanted portions of boron, when carrying out thermal oxidation to the substrate 1. Therefore, the device separation region 10 has a steep slope to the surface of the substrate 1 (see FIG. 3A). When a thin layer (for instance aluminum layer 25) is formed on the device separation region 10 as a wiring layer, the aluminum layer 25 is not able to be formed uniformly thereon, due to the steepness of the layer. That is, thickness of the aluminum layer 25 located on top of the device separation region 10 (as thickness TH1) and thickness of the aluminum layer 25 located on the slope of the region (as thickness TH2) are different from each other (see FIG. 3A). Therefore, it is not possible to form a layer on the device separation region 10 uniformly, so that reliability of the semiconductor devices is decreased through low coverage and disconnection of the layer located on the region.

SUMMARY OF THE INVENTION

It is an object of the present invention to provide a method for manufacturing a device separation region for a semiconductor device which can be stably separated from each other electrically, and which realizes large scale integration with high reliability.

A method for manufacturing a device separation region for a semiconductor device, comprises the steps of:

a) first step for forming an initial oxide layer, thinner than a device separation layer formed in predetermined thickness using a first mask by thermal oxidation to a substrate;

b) second step for cover the initial oxide layer partially by a second mask;

c) third step for carrying out thermal oxidation until the initial oxide layer reaches to predetermined thickness, after the second step.

While the novel features of the invention are set forth in a general fashion, both as to organization and content, the invention will be better understood and appreciated, along with other objects and features thereof, from the following detailed description taken in conjunction with the drawings.

DESCRIPTION OF THE PREFERRED EMBODIMENT

An embodiment to form a device separation region by utilizing a method for manufacturing a device separation region for semiconductor devices according to the present invention will be disclosed based on the figures. In this embodiment, the device separation region is formed by LOCOS method.

Figure 4A:
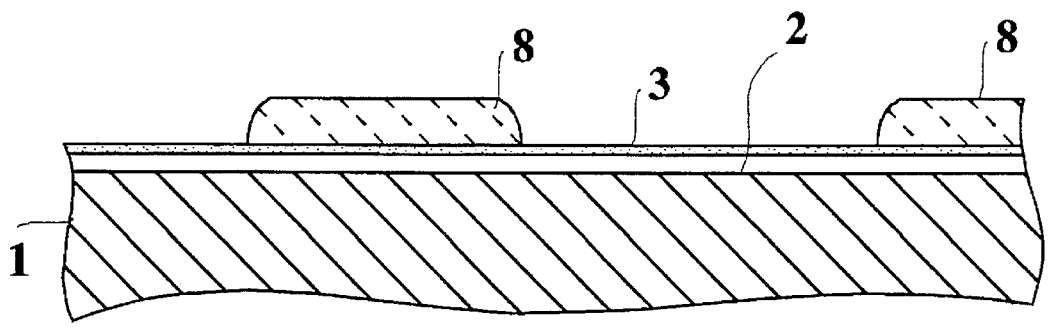
FIG. 4A, FIG. 4B and FIG. 4C are sectional view illustrating steps for manufacturing a device separation region for semiconductor devices in the present invention.
Figure 4B:
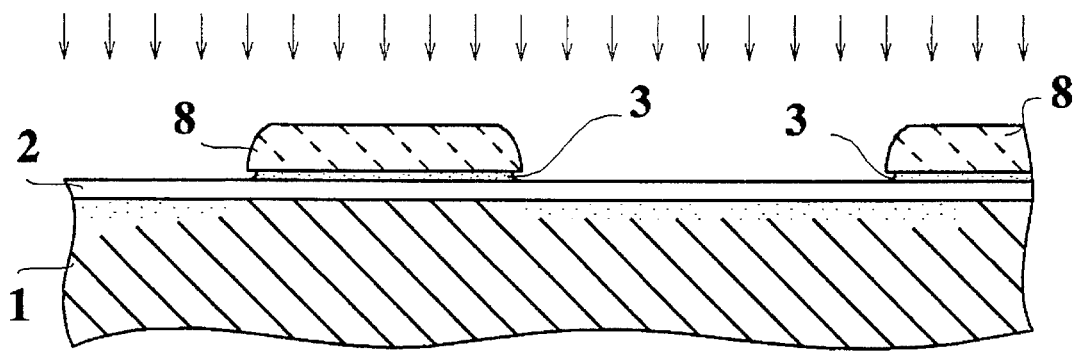

Initially, a silicon oxide layer 2 is formed on a substrate 1 by thermal oxidation, then a first silicon nitride layer 3 is formed on the silicon oxide layer 2 by low pressure chemical vapor deposition (hereinafter referred as LPCVD) method. Upon forming the first silicon nitride layer 3, a photo resist layer 8 is formed on the first silicon nitride layer 3 at a predetermined position (FIG. 4A). After forming the photo resist layer 8, the first silicon nitride layer 3 is removed by chemical etching, then boron is implanted ionically into the substrate 1 by utilizing the photo resist layer 8 as a mask (FIG. 4B). Further, thermal oxidation is carried out to the substrate 1 which completes implantation of boron.

Figure 4C:
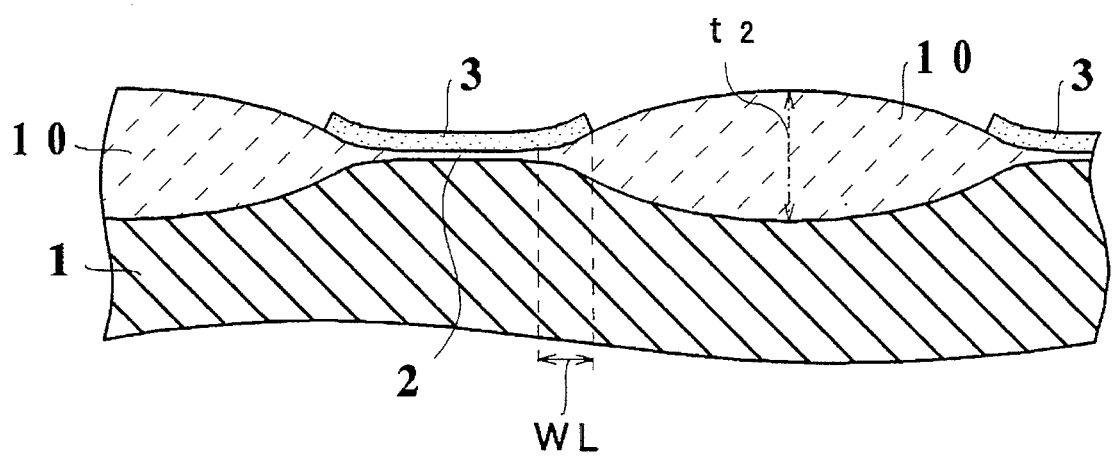

In this embodiment, in order to form thinner device separation region 10 (to thickness t2) than the predetermined thickness t (see FIG. 2B), thermal oxidation of the above process is controlled (FIG. 4C). During the thermal oxidation, the ratio of expansion for the device separation region 10 is much higher than the first silicon nitride layer 3. Therefore, thickness of the device separation region 10 is able to be controlled easily. Also, to form thinner device separation region (thickness t2) than predetermined thickness t limits the expansion of the device separation region 10 toward horizontal direction HZ100 in comparison with the conventional method set forth in above. As a result, width WL of the bird's beak in this embodiment can be narrowed than the width W of bird's beak in the conventional method.

Figure 5A:
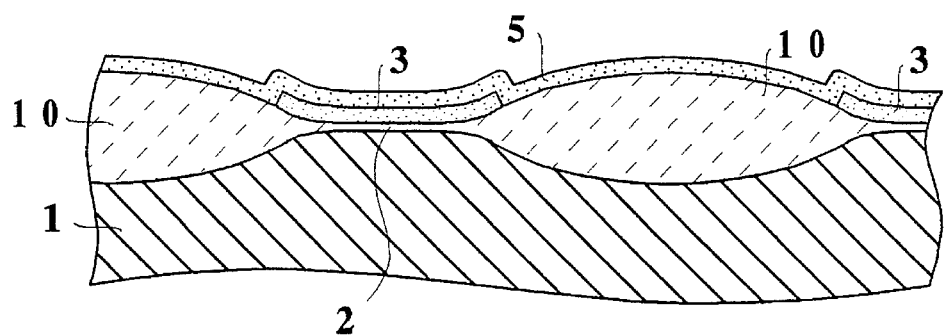
FIG. 5A, FIG. 5B and FIG. 5C are sectional views illustrating steps for manufacturing a device separation region for semiconductor devices in the present invention.
Figure 5B:
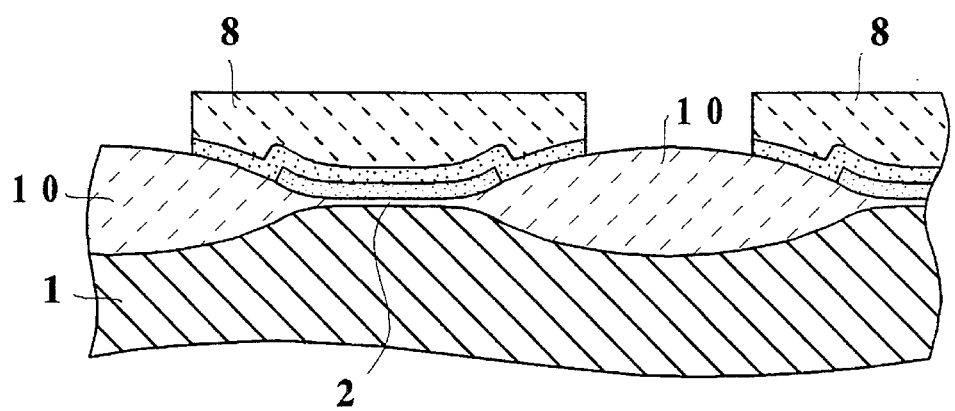

Thereafter, a second silicon nitride layer 5 is formed onto whole surface of the substrate 1 by LPCVD method (FIG. 5A). Then a photo resist layer 8 is formed partially on the second silicon nitride layer 5. Upon forming the photo resist layer 8, the second silicon nitride layer 5 is removed as to the second silicon nitride layer 5 which remains over the first nitride layer 3 (FIG. 5B). At this stage, thickness of overlapped area ED15 for the second silicon nitride layer 5 and the first silicon nitride layer 3 is substantially the equivalent to the sum of thickness for the second silicon nitride layer 5 and the first silicon nitride layer 3.

Figure 5C:
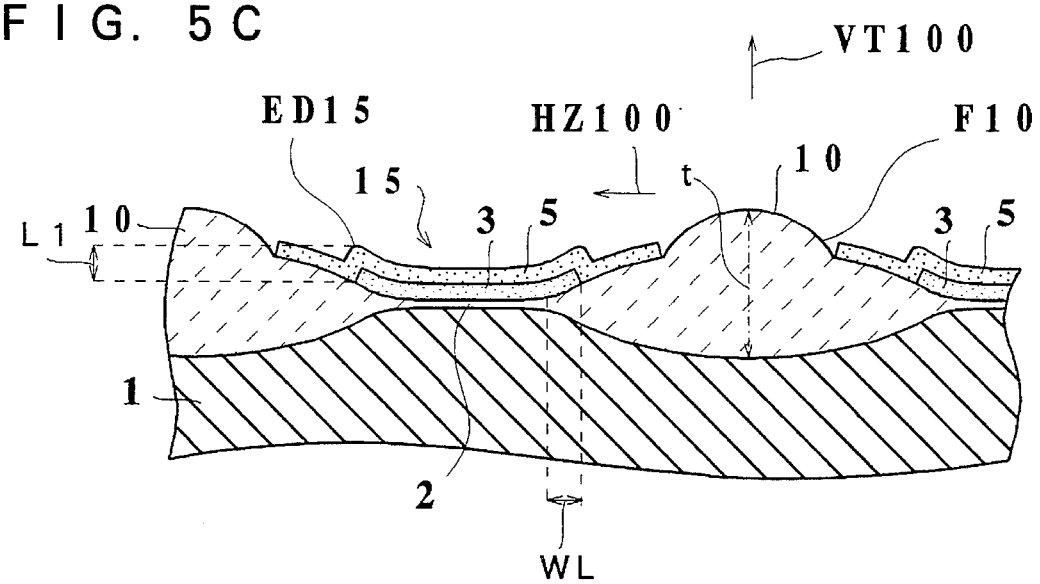

After removal of the second silicon nitride layer 5, the photo resist layer 8 is removed by chemical etching, then thermal oxidation is carried out again. During the thermal oxidation, center portion of the device separation region 10 which is not covered by the first silicon nitride layer 3 and the second silicon nitride layer 5 expands in thickness t (FIG. 5C).

That is, a convex portion F10 is formed, due to the second silicon nitride layer 5 which limits the expansion of the device separation region 10 toward horizontal direction HZ100. That is, the expansion of the device separation region 10 toward vertical direction VT100 is allowed. Since the center portion of the device separation region 10 is formed as predetermined thickness t, it is possible to prevent making the channel as well as accomplish stable device separation.

Figure 1A:
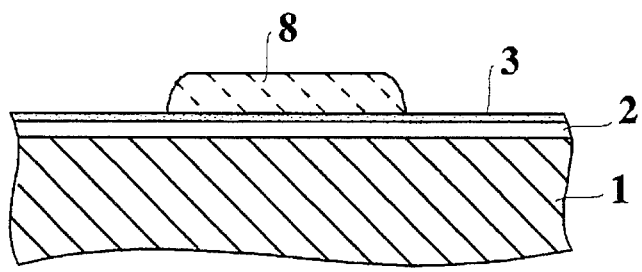
FIG. 1A, FIG. 1B and FIG. 1C are the view illustrating steps of forming a device separation layer in conventional method for manufacturing a device separation region for semiconductor device.
Figure 1B:
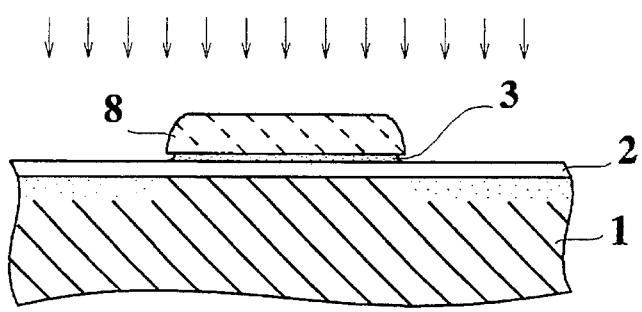
Figure 1C:
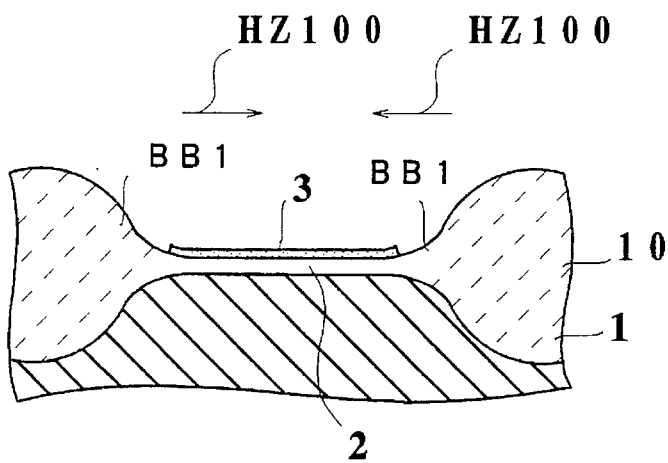
Figure 2A:
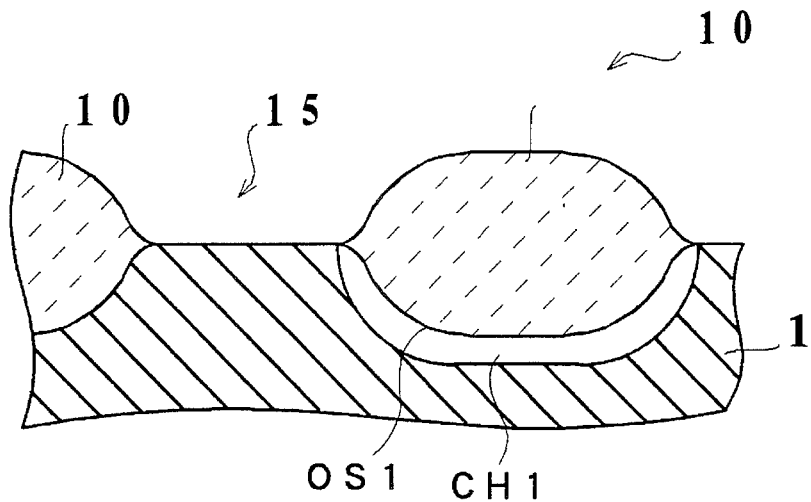
FIG. 2A is a view illustrating a channel made under the device separation layer in conventional method for manufacturing a device separation region for semiconductor device.

Further, in this embodiment, the device formation region 15 is not narrowed, due to control of thermal oxidation which limits the occurrence and the width W of the bird's beak. That is, the device formation region 15 can be formed larger than the conventional device formation region (see FIG. 2A), so that large scale integration of the semiconductor device can be realized.

Therefore, it is possible to manufacture a semiconductor device which accomplishes stable device separation as well as realizing large scale integration with high reliability by utilizing a method for manufacturing a device separation region for semiconductor device according to the present invention.

In the meantime, by utilizing a method for manufacturing a device separation region for semiconductor device in this embodiment, the device separation region 10 is formed as shown in FIG. 5C. So that, the slope of the device separation region 10 formed by this embodiment is much more gentle than in comparison with the slope of the device separation region formed by conventional method. Consequently, a layer on the device separation region 10 can be formed uniformly.

That means, for instance, thickness of a wiring layer (not shown) formed on a convex F10 can be formed identically with the wiring layer (not shown) on the other part of the device separation region 10. Therefore, it is possible to form the wiring layer uniformly, so that, coverage is increased at the device separation region. As a result, possibility of disconnection for the wiring layer caused by low coverage due to forming non uniform layer is decreased. Consequently, a semiconductor device having high reliability is obtainable.

Figure 6A:
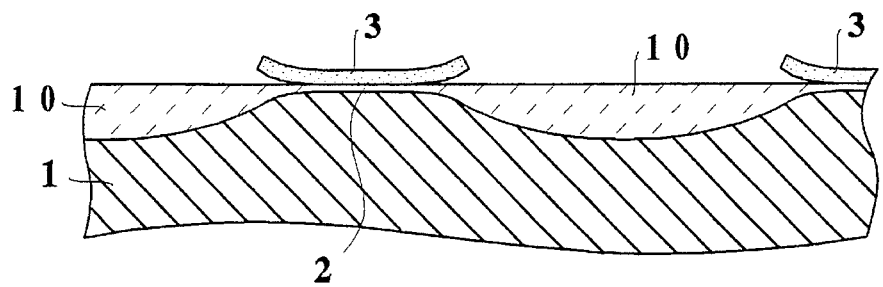
FIG. 6A, FIG. 6B, FIG. 6C and FIG. 6D are sectional views illustrating steps of another embodiment of a method for manufacturing a device separation region for semiconductor devices as shown in FIG. 4A to FIG. 4C and FIG. 5A to FIG. 5C.
Figure 6B:
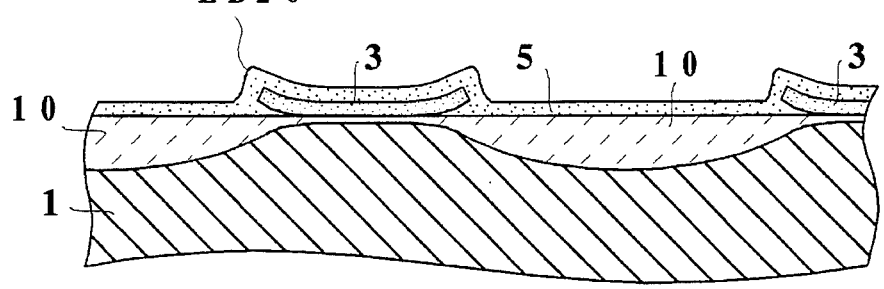
Figure 6C:
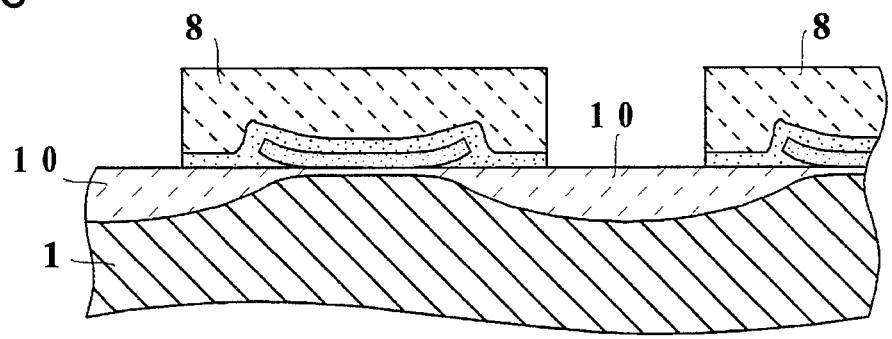

Moreover, another embodiment of a method for manufacturing a device separation region for a semiconductor device according to the present invention will be disclosed below. In this embodiment, the device separation region 10 formed as shown in FIG. 4C, is removed until a surface of the device separation region 10 is substantially level with a surface of the substrate 1 by chemical etching (FIG. 6A). After the etching, a second nitride layer 5 is formed onto the whole surface of the substrate 1 by LPCVD method (FIG. 6B). Thereafter, a photo resist layer 8 is formed partially on the second silicon nitride layer 5. Upon forming the photo resist layer 8, the second silicon nitride layer 5 is removed except the second silicon nitride layer 5 remains over the first nitride layer 3 (FIG. 6C). After etching of the second silicon nitride layer 5, the photo resist layer 8 is removed by chemical etching, then thermal oxidation is carried out.

Figure 6D:
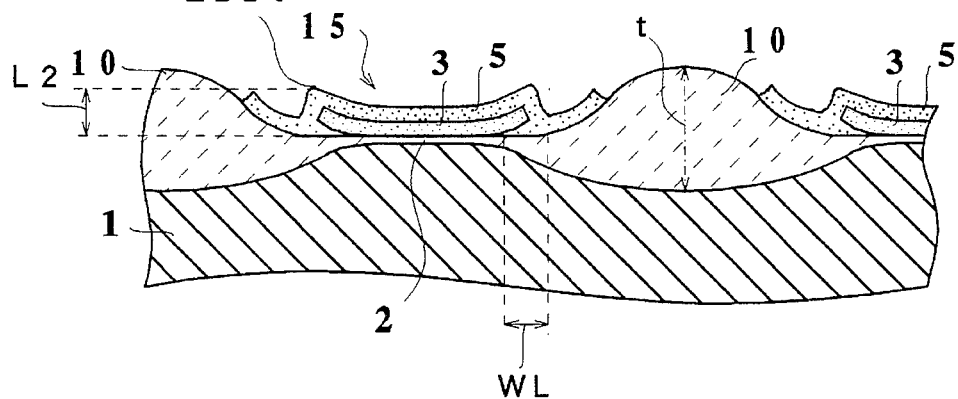

During the thermal oxidation, the device separation region 10, once removed until substantially identical level with a surface of the substrate 1 expands as shown in FIG. 6D. That is, in this embodiment, expansion of the device separation region 10 toward horizontal direction HZ100 is limited by the second silicon nitride layer 5 and expansion of the device separation region 10 toward vertical direction VT100 is allowed. In this way, the center portion of the device separation region 10 is formed to thickness t as shown in FIG. 6D. Therefore, it is possible to prevent the channel from forming as well as to accomplish stable device separation.

Further, thickness L2 of the overlapped area ED20 for the second silicon nitride layer 5 and the first silicon nitride layer 3 in this embodiment(FIG. 6D) is thicker than thickness L1 of the overlapped area ED15 for the second silicon nitride layer 5 and the first silicon nitride layer 3 in the first embodiment (FIG. 5C). This is because the second silicon nitride layer 5 is also formed back of the edge of first silicon nitride layer 3.

Usually, length of the bird's beak is inverse to the thickness of nitride layer(s) formed thereon. That is, thicker nitride layer(s) can limit the length of bird's beak. That is, the length of bird's beak under the second silicon nitride layer 5 and the first silicon nitride layer 3 in this embodiment is shorter than in the above disclosed embodiment (see FIG. 6D).

Therefore, wider device separation region 15 is obtainable in comparison with a semiconductor formed by conventional method and the above disclosed embodiment. As a result, a semiconductor device with much larger scale integration can be manufactured.

Figure 2B:
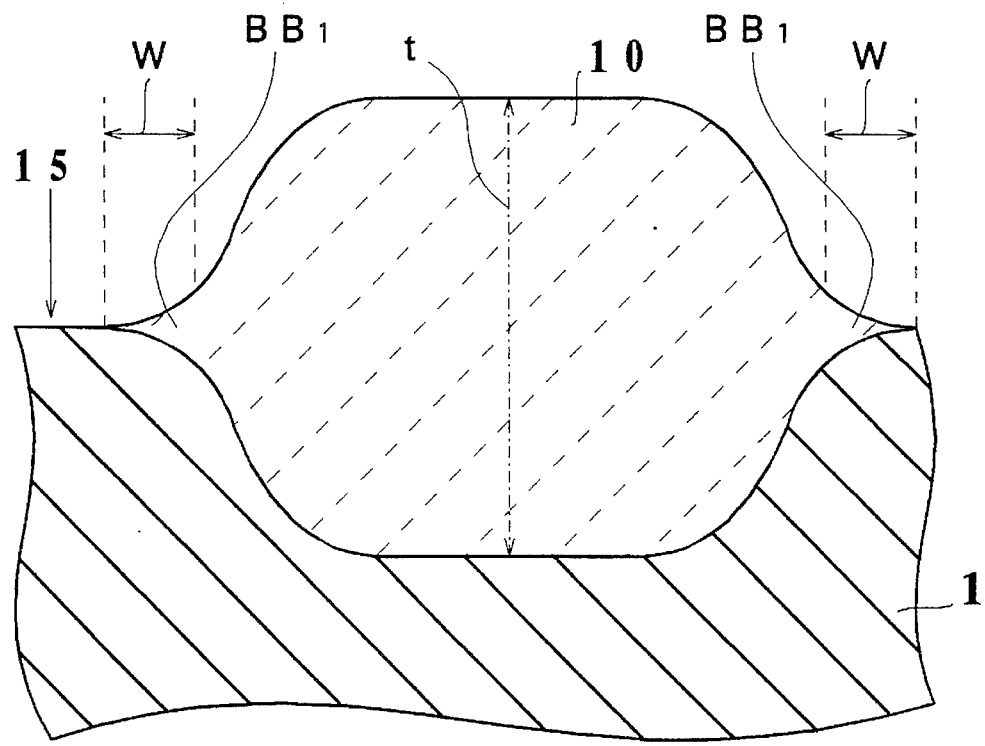
FIG. 2B is an enlarged sectional view illustrating the device separation layer formed the conventional method for manufacturing a device separation region for semiconductor device.
Figure 3A:
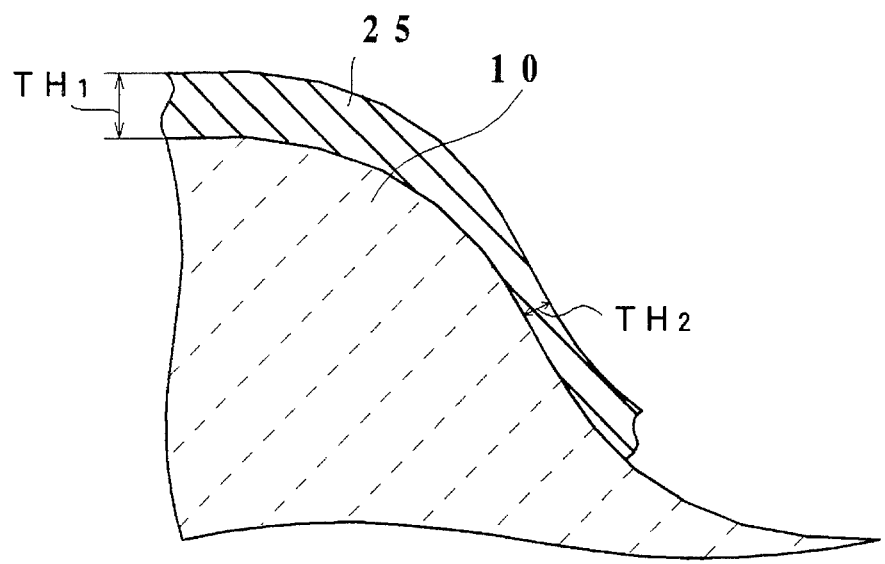
FIG. 3A is a sectional view illustrating a slope of the device separation region formed by conventional method for manufacturing a device separation region for semiconductor device.
Figure 3B:
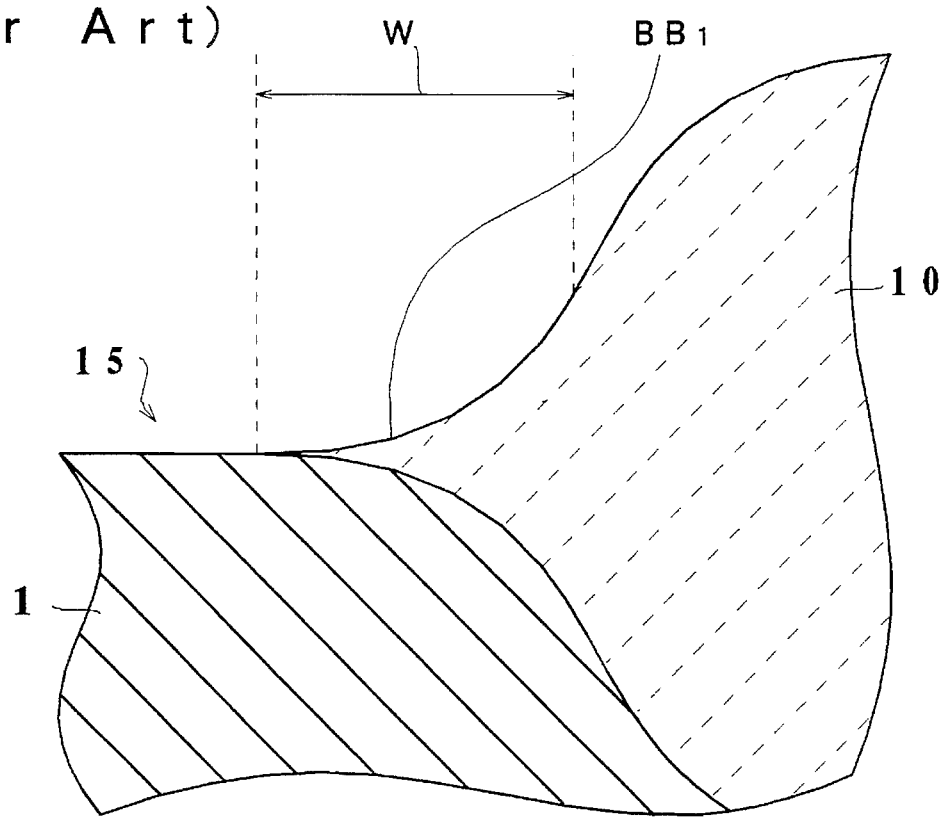
FIG. 3B is a sectional view illustrating width of a bird's beak formed by conventional method for manufacturing a device separation region for semiconductor device.

Furthermore, the slope of the device separation region 10 formed by this embodiment is much more gentle than the slope formed by conventional method(see FIG. 2B, FIG. 6C). Consequently, a layer on the device separation region 10 can be formed uniformly.

Therefore, by utilizing this embodiment, a semiconductor device having high reliability is obtainable.

Although the invention has been described in its preferred form with a certain degree of particularity, it is understood that the present disclosure of the preferred form has been changed in the details of its construction and any combination and arrangement of parts may be resorted to without departing from the spirit and the scope of the invention as hereinafter claimed.

What is claimed is:

1. A method for manufacturing a device separation region for semiconductor devices, comprising the steps of:

forming an oxide layer on a substrate and then using a first mask, growing by thermal oxidation first portions relative to second portions of said oxide layer to a first thickness, said first portions having first surfaces and said second portions having second surfaces;

altering said first surfaces to become altered first surfaces which are substantially level with said second surfaces;

growing further by thermal oxidation and with use of a second mask said first portions relative to said second portions of said oxide layer to a second thickness, said second thickness being thicker than said first thickness.

2. A method for manufacturing a device separation region for semiconductor devices in accordance with claim 1;

wherein altering of said first surfaces of the oxide layer is carried out by dry etching in the altering step.

3. A method for manufacturing a device separation region for semiconductor devices in accordance with claim 1;

wherein altering of said first surfaces of the oxide layer is carried out by mechanical etching in the altering step.

4. A method for manufacturing a device separation region for semiconductor devices in accordance with claim 1;

wherein altering of said first surfaces of the oxide layer is carried out by chemical etching in the altering step.

\* \* \* \* \*